United States Patent [19]
Urano et al.

[11] Patent Number: 5,317,526
[45] Date of Patent: May 31, 1994

[54] FORMAT CONVERSION METHOD OF FLOATING POINT NUMBER AND DEVICE EMPLOYING THE SAME

[75] Inventors: Miki Urano; Takashi Taniguchi, both of Osaka, Japan

[73] Assignee: Matsushita Electric Industrial Co., Ltd., Osaka, Japan

[21] Appl. No.: 948,657

[22] Filed: Sep. 23, 1992

[30] Foreign Application Priority Data

Sep. 25, 1991 [JP] Japan .................................. 3-245995

[51] Int. Cl.$^5$ .............................................. G06F 7/38
[52] U.S. Cl. .................................................. 364/715.03
[58] Field of Search ........................... 364/715.03, 748; 341/50

[56] References Cited

U.S. PATENT DOCUMENTS

4,831,575  5/1989  Kuroda ........................ 364/715.03
4,949,291  8/1990  Saini ............................ 364/715.3

*Primary Examiner*—Long T. Nguyen
*Attorney, Agent, or Firm*—Willian Brinks Hofer Gilson & Lione

[57] ABSTRACT

At a format conversion of a floating point number from double-precision to single-precision, a temporary exponent $e_1$ is obtained by subtracting a double-precision bias $B_d$ from an exponent E of an operand and by adding a single-precision bias $B_s$ thereto. A mantissa M of the operand is shifted to right by a number obtained by adding 1 to an absolute value of the exponent $e_1$ when $e_1 \leq 0$. When $e_1 > 0$, the mantissa M is not shifted. the result is rounded to a 23-bit length. When no carry is caused, the rounded value and 0 (when $e_1 \leq 0$) or $e_1$ (when $e_1 > 0$) are respectively a mantissa and an exponent to be obtained. The rounded value and $e_1 + 1$ are regarded as a conversion result when $e_1 = 0$ and a carry is caused. A value obtained by shifting the rounded value to right by 1 bit and $e_1 + 1$ are selected when $e_1 > 0$ and a carry is caused. Accordingly, denormalization is executed with a high speed without interrupting a procedure being executed, and conversion results can be always obtained with a minimum number of procedures.

9 Claims, 4 Drawing Sheets

FORMAT CONVERSION METHOD OF FLOATING POINT NUMBER AND DEVICE EMPLOYING THE SAME

BACKGROUND OF THE INVENTION

This invention relates to a method of converting a format for a binary floating point number of IEEE (Institute of Electrical and Electronic Engineers) standard 754 or one which is conformed thereto, and a device employing the same.

Recently, in accordance with complicated scientific application and graphic procedure in a computer, high speed, precise floating point operation is desired. Errors in results of floating point operations caused by the computer hardware construction are eliminated by following the IEEE Std 754.

In the IEEE Std 754, a format whose total bit number is 32, a 1-bit sign S, an 8-bit exponent E and a 23-bit fraction F, is specified for a single-precision floating point number. Usually, normalization is performed by adjusting a value of the exponent E so that a virtual non-zero value bit and a radix point are located upper than a most significant bit (MSB) of the fraction F. Wherein, a value obtained by adding 127 as a bias $B_s$ to an actual exponent is made the exponent E so that the exponent E is a positive value. Namely, an real number $R_1$ expressed as a normalized number is as follows.

$$R_1 = (-1)^S 2^{E-127}(1.F) \qquad (1)$$

Wherein, 1.F in the equation (1) is a mantissa M. However, when the normalization is performed even in case where a result is a neighborhood value of 0, the calculation precision lowers drastically. Therefore, in such a case, in the IEEE Std 754, the real value is expressed as an denormalized number. In other words, the exponent E is made 0, and the fraction F is shifted so that the weight of zero value bit 1-bit upper than the radix point is $2^{-126}$. In this case, the real value $R_2$ expressed as the denormalized number is as follows.

$$R_2 = (-1)^S 2^{-126}(0.F) \qquad (2)$$

In this case, the mantissa M is 0.F.

In the IEEE Std 754, as a format of 64 bits long double-precision floating point number, specified is a numerical representation composed of a 1-bit sign S, an 11-bit exponent E and a 52-bit fraction F. In this case, a real number $R_3$ is as follows.

$$R_3 = (-1)^S 2^{E-1023}(1.F) \qquad (3)$$

A value obtained by adding 1023 as a bias $B_d$ to a real exponent is made the exponent E. The mantissa M is 1.F.

In the IEEE Std 754, there is no specification for a format of a fixed point number. Usually employed is a format of integer type fixed point number having a most significant bit (MSB) expressing a sign so as to express the negative number by 2's complement and an integer part of predetermined bit length. In a 32-bit integer, the MSB is a sign bit, the other 31 bits compose the integer part, and the radix point is located lower than a least significant bit (LSB) of the integer part.

A floating point arithmetic instruction set includes instructions for various format conversions, so that a conversion between different formats are executed as required.

According to a comparison of the equation (1) and the equation (3), it is found that a range of the real value expressed by the normalized single-precision floating point number is narrower than that expressed by the double-precision floating point number. Therefore, there is a case where a format of the denormalized number according to the equation (2) must be employed for a format conversion from a double-precision floating point number to a single-precision floating point number. In a conventional computer, however, a hardware is optimized for operation of a normalized floating point number, so that when an operation result is a denormalized number, a procedure by the hardware is interrupted for regarding the case as an exception and a procedure of the denormalized number is entrusted to a software. In consequence, there rises a problem that the format conversion from the double-precision floating point number to the single-precision floating point number is performed with a less speed.

On the other hand, the number of procedures to be executed for obtaining a final conversion result is different according to an object of the format conversion, i.e., a value of operand. For example, in case where a format of an operand expressed as the double-precision floating point number is converted to the single-precision floating point number, in the IEEE Std 754, the number of significant bits (=24, wherein a virtual bit 1-bit upper than the radix point is included) of mantissa of single-precision floating point number obtained as above is always smaller than the number of significant bits (=53) of the operand, which requires a rounding procedure of the mantissa without failure. Nevertheless, there is a case correction to an exponent and a mantissa is required according to a carry caused by the rounding procedure. While, in case where a format of an operand expressed as a 32-bit integer is converted to the single-precision floating point number, the operand must be made to be an absolute value thereof when the operand is a negative value. Likewise, only when the operand is a positive value and the number of significant bits of the 31-bit length integer part of the operand is larger than 24, that of the single-precision floating point number, the rounding procedure is required. When a carry is caused by the rounding procedure, an exponent and a mantissa of the single-precision floating point number to be obtained must be corrected. However, conventionally, every procedure is executed for a format conversion instruction even in case where some procedures can be omitted, thus remaining conversion efficiency low.

The present invention has its object to execute a format conversion dealing with a floating point number with a high speed and high efficiency.

SUMMARY OF THE INVENTION

To attain the above object, in the present invention, when a format conversion of a floating point number from high-precision to low-precision, such as from a double-precision floating point number to a single-precision floating point number, is executed, obtained is a temporary exponent $e_1$ to be an exponent of single-precision floating point number obtained from the exponent E of the operand, considering the exponent bias of both floating point numbers, it is judged whether the exponent $e_1$ is a positive value, 0 or a negative value, then the flow of the format conversion procedures is controlled according to each case.

For example, at a format conversion from double-precision floating point number to single-precision floating point number, a temporary exponent $e_1$ is obtained by subtracting exponent bias $B_d$ of the double-precision floating point number from the exponent E of the operand and adding the exponent bias $B_s$ of the single-precision floating point number. The single-precision floating point number to be obtained is a denormalized number without failure when $e_1$ is a negative value, and is a normalized number without failure when $e_1$ is a positive value. When $e_1$ is 0, the single-precision floating point number to be obtained is a normalized number or a denormalized number. Corresponding thereto, the case is branched in accordance with whether the exponent $e_1$ is a positive value, 0 or a negative value. Then, the flow of the format conversion procedure is controlled according to each case. Consequently, the procedure can terminate at the time when a conversion result is obtained early, thus enhancing the conversion efficiency. Further, the format conversion can be continued with the already obtained temporary exponent $e_1$ even in case of denormalization, which leads to a high speed conversion without nullifying the procedure having executed at that time.

When a format conversion from a fixed point number to a floating point number, such as from a 32-bit integer to a single-precision floating point number is executed, the flow of the format conversion procedure is controlled according to a sign of the operand and the number of significant bits.

For example, at a format conversion from the 32-bit integer as an operand to the single-precision floating point number, when the operand is a negative value, it is made to be an absolute value. When the operand is a positive value, it is judged whether a rounding procedure is executed according to a relation between the number of significant bits of the operand and that of the single-precision floating point number to be obtained. In this way, by controlling the flow of the format conversion procedure according to the sign of the operand and the number of significant bits thereof, the procedure can terminate at the point when the conversion result is obtained early, thus enhancing the conversion efficiency.

PREFERRED EMBODIMENT OF THE PRESENT INVENTION

A description is made below about two kinds of format conversion methods for floating point number and format converting devices directly employing the respective methods according to embodiments of the present invention, with reference to accompanying drawings.

FIRST EMBODIMENT

Figure 1:
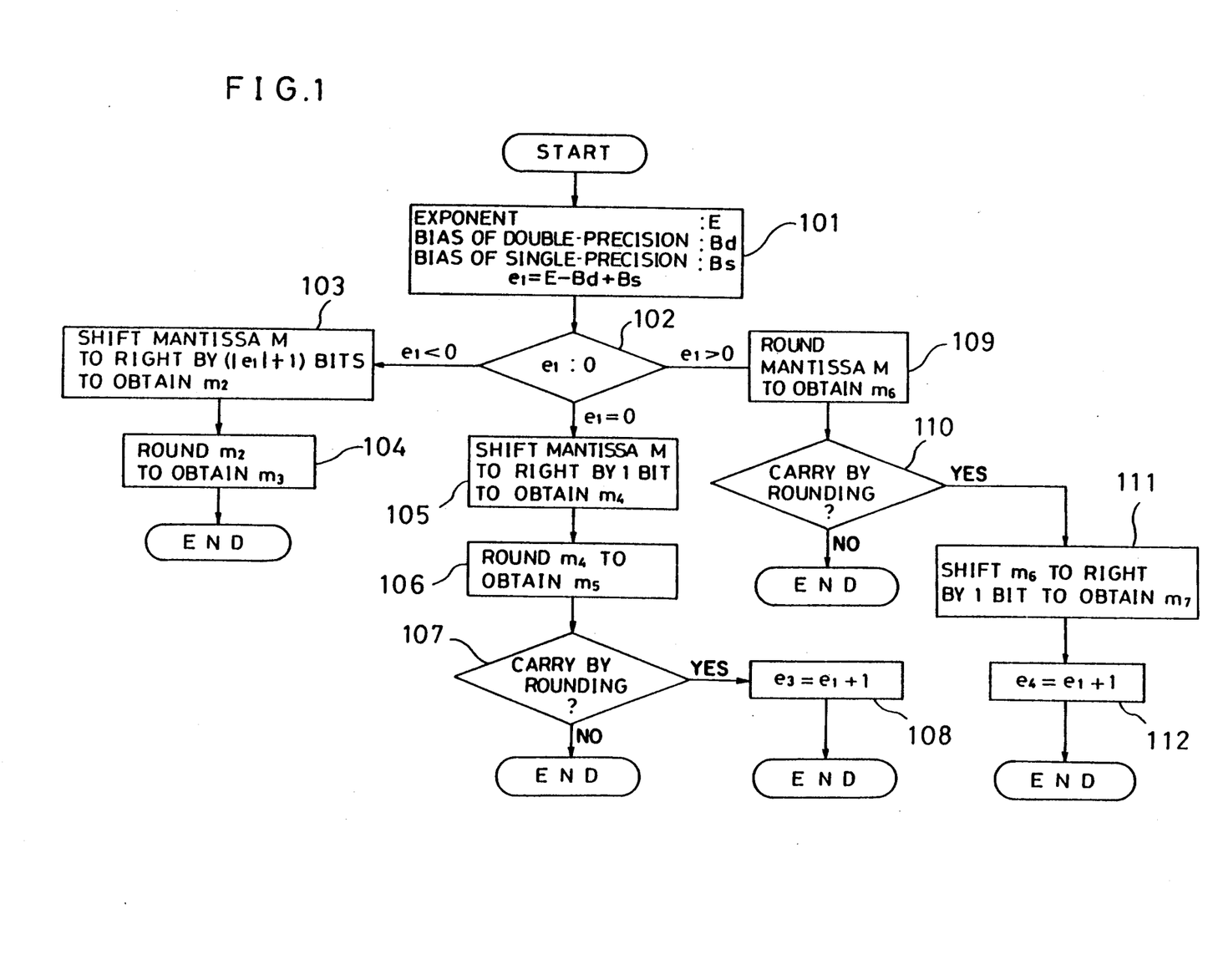
FIG. 1 is a flow chart showing a flow of a format conversion procedure from a double-precision floating point number to a single-precision floating point number according to a first embodiment of the present invention.
Figure 2:
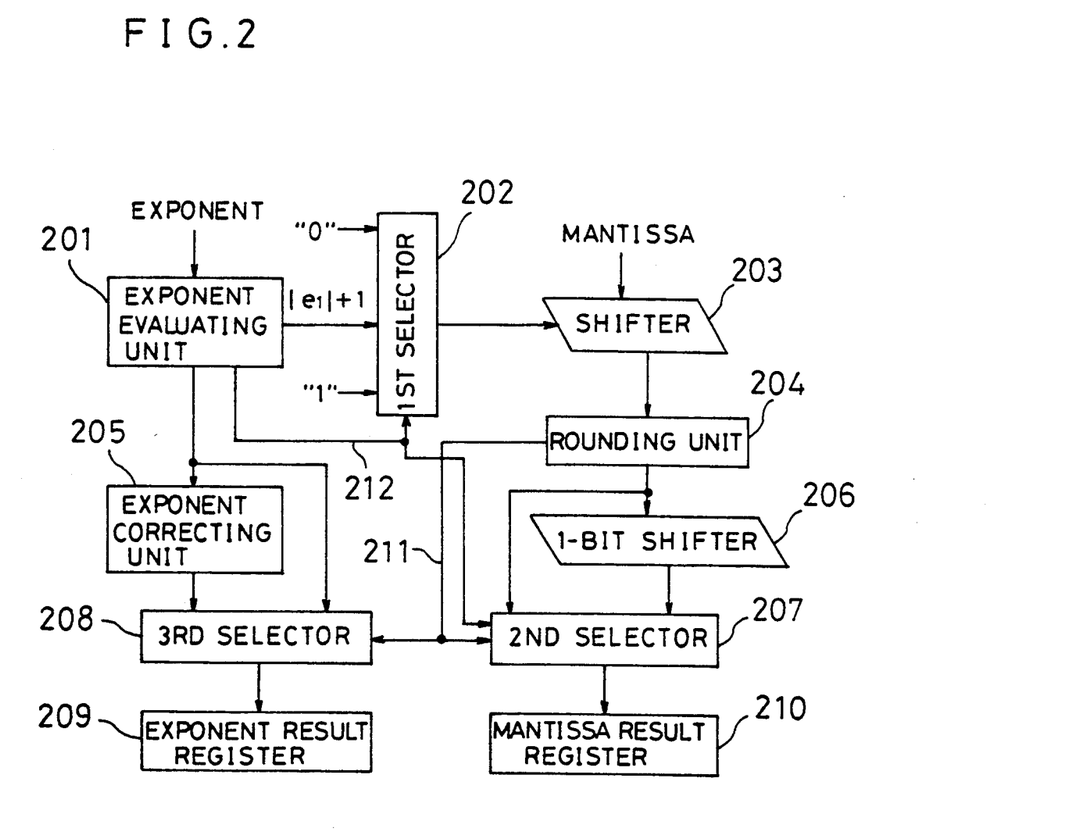
FIG. 2 is a block diagram showing a construction of a format converting device for performing the procedure in FIG. 1.

FIGS. 1 and 2 shows an embodiment regarding a format conversion from a double-precision floating point number to a single-precision floating point number in the IEEE Std 754. Wherein, an exponent and a mantissa of a normalized double-precision floating point number as an operand are expressed by E and M respectively in this embodiment.

Referring to FIG. 1, first, calculation is carried out for obtaining an exponent $e_1$. In detail, as shown at step 101, a real exponent is obtained by subtracting an exponent bias $B_d$ (=1023) of a double-precision floating point number from the exponent E of the operand. The exponent $e_1$ is obtained by adding an exponent bias $B_s$ (=127) of the single-precision floating point number to the real exponent. Then, judged at step 102 is whether the exponent $e_1$ obtained at the step 101 is a positive value, 0 or an negative value.

When the exponent $e_1$ is a negative value, denormalization as follows is executed. In detail, the mantissa M of the operand is shifted to right to change the exponent which is negative to 0. At this time, a bit 1-bit upper than a radix point has its weight of $2^{-127}$, and it is necessary to further shift the mantissa to right by 1 bit since a bit 1-bit upper than the radix point in the denormalized number has its weight of $2^{-126}$ as shown in the equation (2). In other words, a mantissa $m_2$ is obtained by shifting the mantissa M to right by $|e_1|+1$ bits at step 103. Next, as shown at step 104, denormalization terminates by obtaining a mantissa $m_3$ by rounding the mantissa $m_2$ so that the mantissa $m_3$ has 23 bits lower than the radix point. Wherein, no carry is caused by rounding the mantissa $m_2$ at this case. According to the above procedure, the exponent and the mantissa of single-precision floating point number to be obtained are 0 and $m_3$ respectively.

While, when the exponent $e_1$ is 0, since there is a possibility that the single-precision floating point number to be obtained is a denormalized number, the mantissa M is shifted to right by 1 bit to obtain a mantissa $m_4$, as shown at step 105, in order to make the weight of the bit 1-bit upper than the radix point $2^{-126}$. Next, as shown at step 106, the mantissa $m_4$ is rounded to a mantissa $m_5$ so as to have a 23-bit fraction. Then, at step 107, checked is whether a carry is caused by the rounding. When no carry is caused, the single-precision floating point number to be obtained is a denormalized number and the exponent and the mantissa thereof are 0 and $m_5$ respectively. When a carry is caused, the weight of the bit 1-bit upper than the radix point is to be $2^{-127}$ for a normalized number. Therefore, the exponent $e_1$ is corrected by adding 1, as shown at step 108, to obtain an exponent $e_3$ (=1). Accordingly, the exponent and the mantissa of the single-precision floating point number to be obtained are $e_3$ and $m_5$ respectively.

When the exponent $e_1$ is an positive value, at step 109, the mantissa M is rounded to a mantissa $m_6$ so as to have a 23-bit fraction. At step 110, checked is whether a carry is caused by the rounding. When no carry is caused, the exponent and the mantissa of the single-precision floating point number to be obtained are $e_1$ and $m_6$ respectively. When a carry is caused, as shown at step 111, the mantissa $m_6$ is shifted to right by 1 bit to obtain a mantissa $m_7$. Then, at step 112, the exponent $e_1$ is corrected by adding 1 to obtain an exponent $e_4$. In this case, the exponent and the mantissa of the single-precision floating point number to be obtained are $e_4$ and $m_7$ respectively.

According to the present method described above, the flow of the format conversion procedure is controlled according to whether the exponent $e_1$ is a positive value, 0 or a negative value. Thus, even in case where a conversion result is a denormalized number, denormalization is executed without interrupting the procedure therebefore. Further, since most steps of the denormalization is executed by commonly using the steps for normalized number, complicated procedure is avoided and the conversion procedure is executed with a high speed.

As shown in FIG. 2, the exponent E of the operand expressed by the double-precision floating point number is inputted to an exponent evaluating unit 201 in the format converting device of the present invention. The exponent evaluating unit 201 subtracts an exponent bias $B_d (=1023)$ of the double-precision floating point number from the inputted exponent E of the operand and adds an exponent bias $B_s (=127)$ of the single-precision floating point number thereto to obtain the exponent $e_1$. Further, the exponent evaluating unit 201 outputs 0 when the exponent $e_1$ is an negative value or 0 or outputs the exponent $e_1$ when the exponent $e_1$ is an positive value to an exponent correcting unit 205 and a third selector 208. When the exponent $e_1$ is an negative value, the exponent evaluating unit 201 further outputs to a first selector 202 a numerical value $|e_1|+1$ as a right shift amount. Further, the exponent evaluating unit 201 outputs to the first selector 202 and a second selector 207 a sign signal 212 indicating whether the exponent $e_1$ is a positive value, 0 or a negative value. The first selector 202 selects to output the numerical value $|e_1|+1$, 1 or 0 respectively according to whether an evaluated result by the exponent evaluating unit 201 is a negative value, 0 or a positive value.

A shifter 203 as a variable amount shifter shifts the mantissa M of the operand to right by a bit number specified by a numerical value outputted from the first selector 202, then outputs a result to a rounding unit 204. The rounding unit 204 outputs a rounded value obtained by rounding the output of the shifter 203 to a 1-bit shifter 206 and the second selector 207, and outputs to second and third selectors 207, 208 a carry signal 211 indicating whether a carry is caused by the rounding procedure. The 1-bit shifter 206 shifts the rounded value outputted from the rounding unit 204 to right by 1 bit to output it to the second selector 207. The exponent correcting unit 205 adds 1 to the output of the exponent evaluating unit 201 to output it to the third selector 208.

The second selector 207 selects, based on the carry signal 211 outputted from the rounding unit 204, an output of the 1-bit shifter 206 when a carry is caused, or selects an output of the rounding unit 204 when no carry is caused, then the selected data is stored to a mantissa result register 210. Wherein, in case where the sign signal 212 from the exponent evaluating unit 201 indicates that the exponent $e_1$ is 0 or a negative value, the second selector 207 selects the output of the rounding unit 204 regardless of the carry signal 211. The third selector 208 selects, based on the carry signal 211, an output of the exponent correcting unit 205 when a carry is caused or the output of the exponent evaluating unit 201 when no carry is caused, then the selected data is stored to an exponent result register 209.

An operation of the format converting device with the above construction is described below, with reference to FIGS. 1 and 2.

The exponent evaluating unit 201 executes an evaluation as shown at the step 101 to obtain the exponent $e_1$. Whether the obtained exponent $e_1$ is a positive value, 0 or a negative value is informed to the first selector 202 by means of the sign signal 212 (the step 102). When the exponent $e_1$ is a negative value, the first selector 202 selects a numerical value $|e_1|+1$ to output it, thereby processing to the step 103 in FIG. 1.

At the step 103, the shifter 203 outputs to the rounding unit 204 the mantissa $m_2$ obtained by shifting the mantissa M of the operand to right by the bit number specified by the numerical value $|e_1|+1$. At the step 104, the rounding unit 204 rounds the mantissa $m_2$ to obtain the mantissa $m_3$ to output it to the second selector 207. The second selector 207 stores to the mantissa result register 210 the mantissa $m_3$ as a mantissa of the single floating point number to be obtained since the exponent $e_1$ is a negative value. While, the exponent evaluating unit 201 outputs 0 to the third selector 208 since the exponent $e_1$ is a negative value. The third selector 208 selects the output 0 of the exponent evaluating unit 201, then stores it to the exponent result register 209 it as an exponent of the single-precision floating point number to be obtained.

When the exponent $e_1$ is 0, the first selector 202 selects 1 based on the sign signal 212, and at the step 105, the shifter 203 outputs to the rounding unit 204 the mantissa $m_4$ obtained by shifting the mantissa M to right by 1 bit which is specified by the output of the first selector 202. At the step 106, the rounding unit 204 rounds the mantissa $m_4$ to obtain the mantissa $m_5$, then outputs it to the 1-bit shifter 206 and the second selector 207 and also outputs whether a carry is caused by rounding the mantissa $m_4$ as the carry signal 211. At the step 107, checked is whether a carry is caused according to the carry signal 211. Wherein the second selector 207 selects the mantissa $m_5$ from the rounding unit 204 regardless of presence of the carry, then stores it as a mantissa of the single-precision floating point number to be obtained to the mantissa result register 210. When the carry signal 211 indicates that no carry is caused, the exponent evaluating unit 201 outputs 0, and 0 is stored to the exponent result register 209 with the same operation as in the case where the exponent $e_1$ is a negative value. On the other hand, when the carry signal 211 indicates that the carry is caused, the exponent correcting unit 205 corrects the output 0 of the exponent evaluating unit 201 to obtain the exponent $e_3 (=1)$ at the step 108. The third selector 208 selects, based on the carry signal 211, the exponent $e_3$ outputted from the exponent correcting unit 205. Thereafter, the exponent and the mantissa of the single-precision floating point number to be obtained are obtained with the same operation as in the case where the exponent $e_1$ is a negative value.

When the exponent $e_1$ is a positive value, since the first selector 202 selects 0 based on the sign signal 212, the shifter 203 outputs the mantissa M as it is. The step 109 is similar to the step 106. In detail, when a carry is caused by rounding the mantissa M by the rounding unit 204, the exponent and the mantissa of the single-precision floating point number thereafter are obtained with the same operation as in the case where the exponent $e_1$ is 0 and no carry is caused.

While, when a carry is caused by rounding the mantissa M, at the step 111, the 1-bit shifter 206 shifts the mantissa $m_6$ obtained by rounding the mantissa M of the operand to right by 1 bit to obtain the mantissa $m_7$, then outputs it to the second selector 207. The second selector 207 selects the mantissa $m_7$ based on the carry signal 211, then stores it as a mantissa of the single-precision floating point number to be obtained to the mantissa result register 210. The exponent evaluating unit 201 outputs the exponent $e_1$. Thereafter, the conversion result is obtained with the same operation as in the case where the exponent $e_1$ is 0 and a carry is caused.

As described above, according to the format converting device of the present invention, the right-shift amount of the mantissa is controlled according to whether the exponent $e_1$ is a positive value, 0 or a negative value. Thus, even in every case where the exponent $e_1$ is a positive value, 0, or a negative value, the single-precision floating point number is obtainable on a same hardware and the format conversion is executed with a comparatively simple hardware. Further, when the conversion result is obtained early, the procedure can terminate at that time, thus executing an efficient conversion.

It is easy to modify the above embodiment for a format conversion of floating point numbers, for example, from quadruple-precision to double-precision or to single-precision. Also, the present invention is applicable to a floating point number other than that of the IEEE Std 754.

SECOND EMBODIMENT

Figure 3:
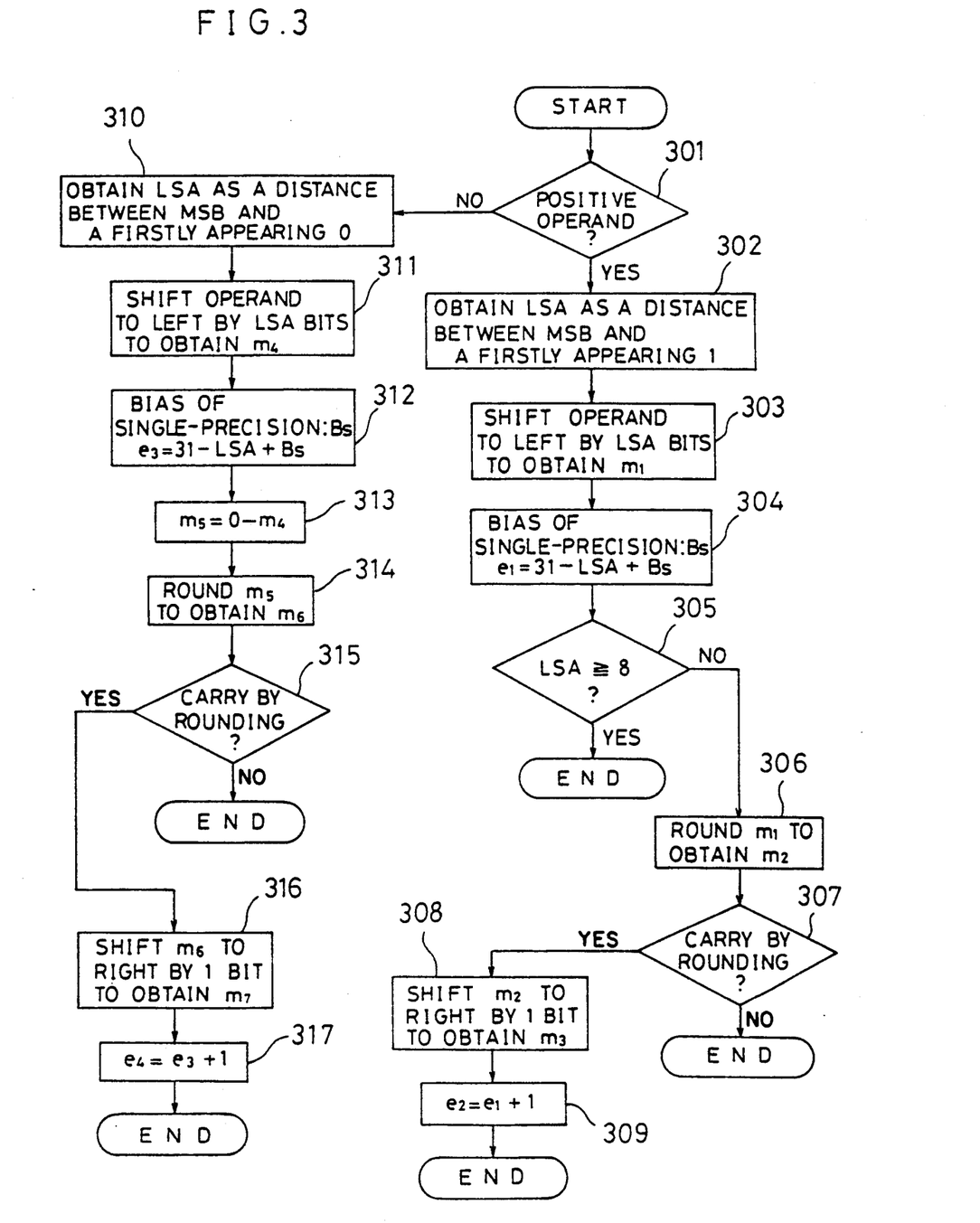
FIG. 3 is a flow chart showing a flow of a format conversion procedure from a 32-bit integer to a single-precision floating point number according to a second embodiment of the present invention.
Figure 4:
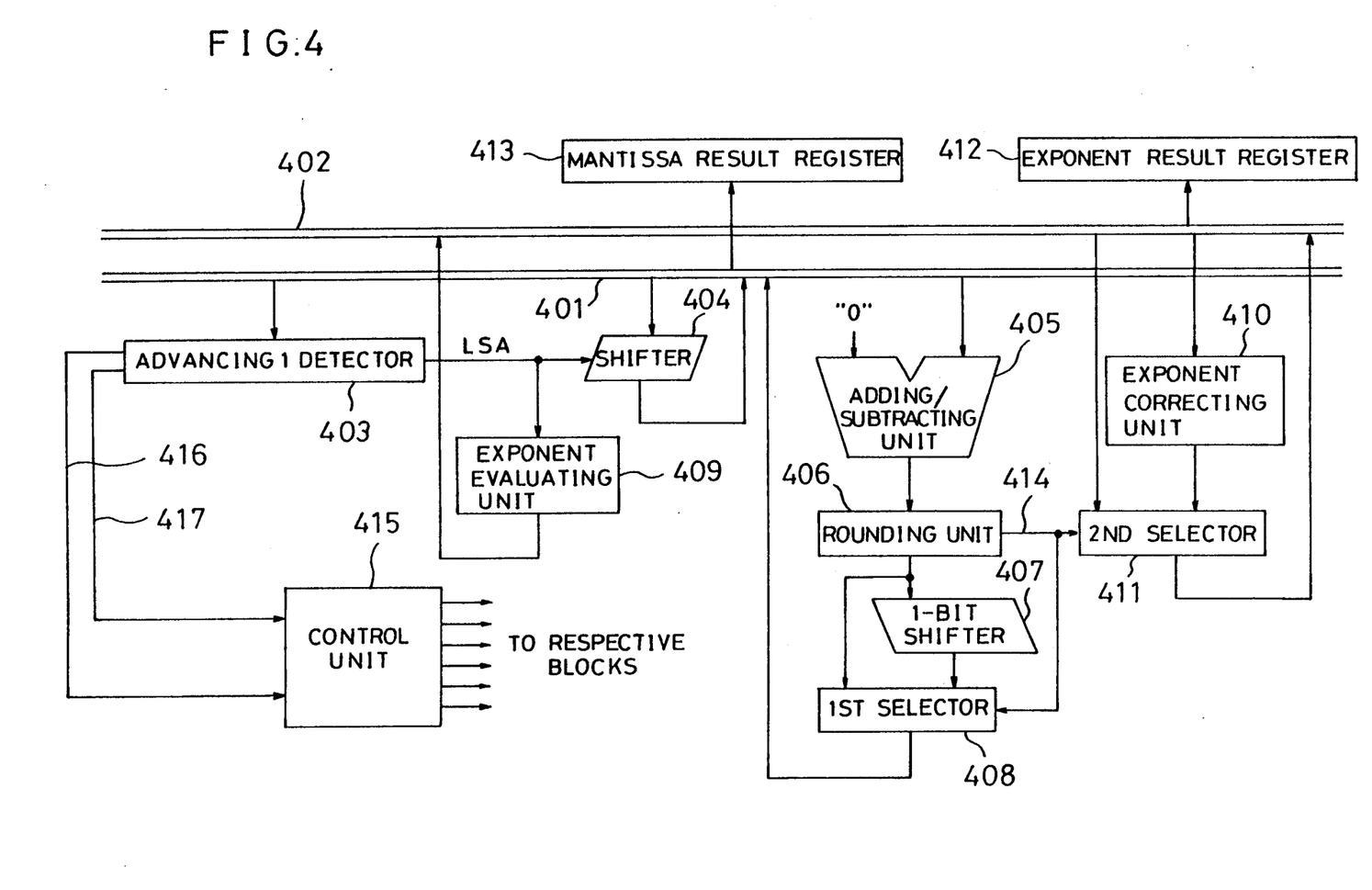
FIG. 4 is a block diagram showing a construction of a format converting device for performing the procedure in FIG. 3.

FIGS. 3 and 4 show an embodiment regarding a format conversion from a 32-bit integer to a single-precision floating point number of the IEEE Std 754. Wherein, as the negative value is expressed by 2's complement, the 32-bit integer as an operand in the embodiment has a most significant bit (MSB) expressing the sign and an integer part of 31-bit length. The 32-bit integer is a positive value when the MSB is 0 and a negative value when the MSB is 1.

Referring to FIG. 3, first, it is judged, based on the MSB of an operand, whether the operand is a positive value including zero or a negative value at step 301.

When the operand is a positive value, in order to find a position of a bit actually having a maximum weight out of the 31-bit integer part of the operand, a search is carried out from a bit 1-bit lower than the MSB toward a least significant bit (LSB) to detect a position of a firstly appearing 1. A distance between the position of the detected bit and that of the MSB is regarded as a required left shift amount (LSA) at step 302. Next, in order to conform the position of the bit actually having the maximum weight out of the 31-bit integer of the operand to a position of a bit 1-bit upper than the radix point in the single-precision floating point number, the operand is shifted to left by the number of bits specified with the LSA to obtain the mantissa $m_1$ at step 303. The number of significant bits of the operand is 32-LSA, accordingly the significant bit has the maximum weight of $2^{31-LSA}$ and this weight is the actual exponent corresponding to the mantissa $m_1$ obtained at the step 303.

Then, at step 304, the exponent $e_1$ corresponding to the mantissa $m_1$ is obtained, using the exponent bias $B_s$ (=127) of the single-precision floating point number as follows.

$$e_1 = 31\text{-}LSA + B_s \qquad (4)$$

In case where the number of significant bits 32-LSA of the operand is larger than that of the single-precision floating point number (=24, wherein a bit 1-bit upper than the radix point is included.), rounding is necessary to accord the number of significant bits of the operand with that of the single-precision floating point number. In the other cases, such a rounding is unnecessary. Namely, in the case where no rounding is required:

$$32\text{-}LSA \leqq 24. \qquad (5)$$

Accordingly;

$$LSA \geqq 8. \qquad (6)$$

Therefore, whether the rounding is necessary can be judged by checking whether the LSA is greater than or equal to 8, as shown at step 305. When the LSA is greater than or equal to 8, rounding is unnecessary. The exponent $e_1$ and the mantissa $m_1$ are respectively the exponent and the mantissa of the single-precision floating point number to be obtained. When the LSA is smaller than 8, the mantissa $m_2$ having a 23-bit fraction is obtained by rounding the mantissa $m_1$ at step 306. Then, at step 307, judged is whether a carry is caused by the rounding. When no carry is caused, the exponent and the mantissa of the single-precision floating point number to be obtained are $e_1$ and $m_2$ respectively. When the carry is caused, the mantissa $m_2$ is shifted to right by 1 bit to obtain the mantissa $m_3$ at step 308. At step 309, 1 is added to the exponent $e_1$ to obtain the exponent $e_2$. The exponent and the mantissa of the single-precision floating point number to be obtained in this case are $e_2$ and $m_3$ respectively.

On the other hand, when the operand is a negative value, since the operand is expressed by 2's complement, in order to find a position of bit actually having a maximum weight out of the 31-bit length integer part, a search is carried out from a bit 1-bit lower than the MSB toward the LSB to detect a position of a firstly appearing 0. As well as in the case where the operand is an positive value, a distance between the position of the detected bit and that of the MSB is regarded as the LSA at step 310. At step 311, the operand is shifted to left by the number of bits specified with the LSA to obtain the mantissa $m_4$. At step 312, as well as at the step 304, the exponent $e_3$ is obtained, using the LSA and the exponent bias $B_s$ (=127) of the single-precision floating point number. While the mantissa $m_4$ obtained in the above way is a negative value expressed by 2's complement, the mantissa of the floating point number is to be expressed by an absolute value. Therefore, at step 313, the mantissa $m_5$ which is an absolute value of the mantissa $m_4$ is obtained by subtracting the mantissa $m_4$ from 0. Then, at step 314, the mantissa $m_5$ is rounded to the mantissa $m_6$ so as to have a 23-bit fraction. Whether a carry is caused by the rounding is judged at step 315. When no carry is caused, the exponent and the mantissa of the single-precision floating point number to be obtained are $e_3$ and $m_6$ respectively. When the carry is caused, the mantissa $m_6$ is shifted to right by 1 bit at step 316 to obtain the mantissa $m_7$. Then, at step 317, the exponent $e_4$ is obtained by adding 1 to the exponent $e_3$. The exponent and the mantissa of the single-precision floating point number to be obtained in this case are $e_4$ and $m_7$ respectively.

According to the present method as described above, the flow of the format conversion procedure is controlled according to whether the operand is a positive value or a negative value and to the number of significant bits of the operand. Thus, the procedure can terminate at the point when the result is obtained early even for the same conversion instruction, and high converting efficiency is achieved.

As shown in FIG. 4, the format converting device in this embodiment has an internal mantissa bus 401 and an internal exponent bus 402. The internal mantissa bus 401 outputs an operand or a mantissa to an advancing 1 detector 403, a sifter 404 as a variable amount shifter, an adding/subtracting unit 405 and a mantissa result register 413. The internal exponent bus 402 outputs an exponent to an exponent correcting unit 410, a second selector 411 and an exponent result register 412.

The advancing 1 detector 403 is provided with the operand, i.e., an input data via the internal mantissa bus 401. From a bit 1-bit lower than the MSB toward the LSB, the advancing 1 detector 403 detects a position of a firstly appearing 1, for the operand when the operand is a positive value, or for data obtained by inverting the operand when the operand is a negative value. As a result, the position of the bit which is 1 and nearest the MSB is detected for a positive value, and the position of the bit which is 0 and nearest the MSB is detected for a negative value. The advancing 1 detector 403 obtains a distance between the position of the detected bit and that of the MSB as a required left shift amount (LSA) in this way to output the LSA to the shifter 404 and an exponent evaluating unit 409. Also, the advancing 1 detector 403 outputs to a control unit 415 a judging signal 416 indicating whether the LSA is greater than or equal to 8 and a sign signal 417 indicating whether the operand is a negative value.

The shifter 404 shifts the operand inputted from the internal mantissa bus 401 to left by the number of bit equal to the LSA outputted from the advancing 1 detector 403 to obtain a left-shifted number, then returns the left-shifted number to the internal mantissa bus 401. The exponent evaluating unit 409 obtains an exponent expressed by $31\text{-}LSA+B_s$, using the LSA outputted from the advancing 1 detector 403 and the exponent bias $B_s$ (=127) of the single-precision floating point number. The obtained exponent is outputted to the internal exponent bus 402.

The adding/subtracting unit 405 outputs to a rounding unit 406 a left-shifted absolute value as an intermediate data based on the left-shifted number outputted from the shifter 404. Namely, the adding/subtracting unit 405 outputs the left-shifted number as it is when the operand is a positive value and outputs a numerical value obtained by subtracting the left-shifted number from 0 when the operand is a negative value. The rounding unit 406 outputs to a 1-bit shifter 407 and a first selector 408 a rounded value obtained by rounding the intermediate data outputted from the adding/subtracting unit 405, and outputs to the first selector 408 and the second selector 411 a carry signal 414 indicating whether a carry is caused by rounding the intermediate data. The one-bit shifter 407 shifts the rounded value outputted from the rounding unit 406 to right by 1 bit, then outputs it to the first selector 408. The first selector 408 selects, based on the carry signal 414, the output from the 1-bit shifter 407 when a carry is caused by rounding the intermediate data and the rounded value inputted from the rounding unit 406 when no carry is caused by rounding the intermediate data, then outputs the selected data as a mantissa to the internal mantissa bus 401.

The exponent correcting unit 410 outputs to the second selector 411 a numerical value corrected by adding 1 to the exponent outputted from the exponent evaluating unit 409. The second selector 411 selects, based on the carry signal 414, an output of the exponent correcting unit 410 when a carry is caused by rounding the intermediate data, and an output of the exponent evaluating unit 409 when no carry is caused by rounding the intermediate data, then outputs the selected data to the internal exponent bus 402. The exponent result register 412 stores the exponent outputted to the internal exponent bus 402 and the mantissa result register 413 stores the mantissa outputted to the internal mantissa bus 401.

The control unit 415 sends a control signal for operating each block from 403 to 413 so that each block executes necessary procedure for converting the format from the 32-bit integer to the single-precision floating point number. The control unit 415 also judges, based on the judging signal 416 from the advancing 1 detector 403 and the sign signal 417, whether the format conversion terminates.

An operation of the format converting device with the above construction is described below, with reference to FIGS. 3 and 4.

First, an operand is supplied to the internal mantissa bus 401 and inputted to the advancing 1 detector 403. In the advancing 1 detector 403, whether the operand is a positive value or a negative value is judged at the step 301.

When the operand is a positive value, the advancing 1 detector 403 detects a position of a bit which is 1 and nearest the MSB in the operand, then outputs a distance between the position of the detected bit and that of the MSB as a required left shift amount LSA to the shifter 404 and the exponent evaluating unit 409 as shown at the step 302. Next, at the step 303, the shifter 404 shifts the operand inputted from the internal mantissa bus 401 to left by the number of bits equal to the LSA outputted from the advancing 1 detector 403 to obtain the mantissa $m_1$. The mantissa $m_1$ is outputted to the internal mantissa bus 401, then stored in the mantissa result register 413. The exponent evaluating unit 409 evaluates the exponent $e_1 = 31 - LSA + B_s$, using the LSA outputted from the advancing 1 detector 403 at the step 304. The evaluated exponent $e_1$ is stored to the exponent result register 412 via the internal exponent bus 402. At this time, if the sign signal 417 from the advancing 1 detector 403 indicates that the operand is a positive value and a judging signal 416 from the advancing 1 detector 403 indicates that the LSA is greater than or equal to 8, the control unit 415 decides the termination of the format conversion. This corresponds to the case where it is judged at the step 305 that the LSA is greater than or equal to 8. Thereby, the exponent $e_1$ stored in the exponent result register 412 is the exponent of the single-precision floating point number to be obtained and the mantissa $m_1$ stored in the mantissa result register 413 is the mantissa to be obtained.

If the sign signal 417 indicates that the operand is a positive value and the judging signal 416 indicates that the LSA is smaller than 8, the control unit 415 performs the control for a continuous format conversion. This corresponds to the case where it is judged at the step 305 that the LSA is smaller than 8, so that the procedure after the step 306 is executed. In detail, the mantissa $m_1$ outputted to the internal mantissa bus 401 is inputted to the adding/subtracting unit 405, the calculation of $0+m_1$ is executed in the adding/subtracting unit 405 since the operand is a positive value, then the resultant of the mantissa $m_1$ is outputted to the rounding unit 406. In the rounding unit 406, the mantissa $m_2$ is obtained by rounding the mantissa $m_1$ at the step 306. At the same time, the carry signal indicating whether a carry is caused by rounding the mantissa $m_1$ is outputted to first and second selectors 408, 411. At the step 307, when it is judged, based on the carry signal 414, that no carry is caused by rounding the mantissa $m_1$, the first selector 408 selects the mantissa $m_2$ outputted form the rounding unit 406, then outputs it to the internal mantissa bus 401. The mantissa $m_2$ outputted to the internal mantissa bus 401 is stored to the mantissa result register 413 as a mantissa of the single-precision floating point number to be obtained. While, the exponent $e_1$ outputted from the exponent evaluating unit 409 to the internal exponent bus 402 is inputted to the second selector 411, then is stored to the exponent result register 412 via the internal exponent bus 402. The exponent $e_1$ stored in the exponent result register 412 is the exponent of the single-precision floating point number to be obtained.

When it is judged, based on the carry signal 414, that a carry is caused by rounding the mantissa $m_1$ at the step 307, the 1-bit shifter 407 shifts the mantissa $m_2$ to right by 1 bit to obtain the mantissa $m_3$, then outputs it to the first selector 408 at the step 308. The first selector 408 outputs the mantissa $m_3$ to the mantissa result register 413 via the internal mantissa bus 401 based on the carry signal 414 from the rounding unit 406. On the other hand, the exponent $e_1$ outputted from the exponent evaluating unit 409 to the internal exponent bus 402 is inputted to the exponent correcting unit 410. The exponent correcting unit 410 adds 1 to the exponent $e_1$ to obtain the exponent $e_2$ as shown at the step 309, then outputs it to the second selector 411. The second selector 411 stores the exponent $e_2$ to the exponent result register 412 via the internal exponent bus 402. In this case, the mantissa of the single-precision floating point number to be obtained is the mantissa $m_3$ stored in the mantissa result register 413, and the exponent thereof is the exponent $e_2$ stored in the exponent result register 412.

In case where the sign signal 417 from the advancing 1 detector 403 indicates that the operand is a negative value, the control unit 415 also performs the control for a continuous format conversion. This corresponds to the case where it is judged at the step 301 that the operand is a negative value, so that procedure after the step 310 is executed. In detail, each bit of the operand is inverted in the advancing 1 detector 403, then detected is a position of the bit which is 1 and nearest the MSB of the inverted data. Such a detection represents a detection of firstly appearing 0 in the operand. Next, a distance between the position of the detected bit and that of the MSB is outputted as a required left shift amount LSA to the shifter 404 and the exponent evaluating unit 409. Then, at the step 311, the shifter 404 shifts the operand inputted from the internal mantissa bus 401 to left by the number of bits equal to the LSA outputted from the advancing 1 detector 403 to obtain the mantissa $m_4$. The mantissa $m_4$ is inputted to the adding/subtracting unit 405. While, in the exponent evaluating unit 409, the exponent $e_1 = 31 - LSA + B_s$ is obtained, using the LSA outputted from the advancing 1 detector 403 at the step 312. The exponent $e_1$ is outputted to the exponent correcting unit 410 via the internal exponent bus 402.

In the adding/subtracting unit 405, at the step 313, the calculation of $m_5 = 0 - m_4$ is executed, using the mantissa $m_4$ outputted from the shifter 404 since the operand is a negative value, then the obtained mantissa $m_5$ is inputted to the rounding unit 406. The rounding unit 406 rounds the mantissa $m_5$ to obtain the mantissa $m_6$ at the step 314. At the same time, the carry signal 414 indicating whether carry is caused by rounding the mantissa $m_5$ is outputted to first and second selectors 408, 411. At the step 315, when it is judged, based on the carry signal 414, that no carry is caused by rounding the mantissa $m_5$, the first selector 408 selects the mantissa $m_6$ outputted from the rounding unit 406 to output it to the internal mantissa bus 401. The mantissa $m_6$ outputted to the internal mantissa bus 401 is stored to the mantissa result register 413 as the mantissa of the single-precision floating point number to be obtained. While, the exponent $e_3$ outputted from the exponent evaluating unit 409 to the internal exponent bus 402 is inputted to the second selector 411, then is stored to the exponent result register 412 via the internal exponent bus 402. The exponent $e_3$ stored in the exponent result register 412 is the exponent of the single-precision floating point number to be obtained.

When it is judged, based on the carry signal 414, that a carry is caused by rounding the mantissa $m_5$ at the step 315, the 1-bit shifter 407 shifts the mantissa $m_6$ to right by 1 bit to obtain the mantissa $m_7$, then outputs it to the first selector 408 at the step 316. The first selector 408 outputs the mantissa $m_7$ to the mantissa result register 413 via the internal mantissa bus 401 based on the carry signal 414 from the rounding unit 406. While, the exponent $e_3$ outputted from the exponent evaluating unit 409 to the internal exponent bus 402 is inputted to the exponent correcting unit 410. The exponent correcting unit 410 adds 1 to the exponent $e_3$ to obtain $e_4$, then outputs it to the second selector 411 at the step 317. The second selector 411 outputs the exponent $e_4$ to the exponent result register 412 via the internal exponent bus 402. In this case, the mantissa of the single-precision floating point number to be obtained is the mantissa $m_7$ stored in the mantissa result register 413, and the exponent thereof is the exponent $e_4$ stored in the exponent result register 412.

According to the present device as described above, the mantissa and the exponent obtained as conversion results are respectively written into the mantissa result register 413 and the exponent result register 412 via the internal mantissa bus 401 and the internal exponent bus 402 respectively. Thus, it is made possible to pick up the written conversion result as a final result, as well as to execute a procedure continuously by reading out thereafter. Further, since the advancing 1 detector 403 and the adding/subtracting unit 405 are controlled according to whether the operand is a positive integer or a negative integer, the format conversion to the single-precision floating point number is executed with a comparatively simple hardware. Moreover, the procedure can terminate at the point when the conversion result is obtained early, thus enhancing the conversion efficiency.

It is easy to modify the above embodiment for a format conversion, for example, from 64-bit integer to double-precision floating point number or to single-precision floating point number.

We claim:

1. A format conversion method for converting a higher-precision floating point number as a normalized operand having an exponent E to which a first bias is added and a mantissa M having a first bit length to a lower-precision floating point number having an exponent $\epsilon$ to which a second bias smaller than the first bias is added and a mantissa $\mu$ having a second bit length shorter than the first bit length, comprising the steps of:

obtaining a first exponent $e_1$ by subtracting the first bias from the exponent E of the operand and by adding the second bias thereto so that the exponent $e_1$ is the exponent $\epsilon$ of the lower-precision floating point number;

determining a shift amount according to whether the first exponent $e_1$ is a positive value, 0 or a negative value; and obtaining a mantissa $\mu$ of the lower-precision floating point number based on a numerical value obtained by conducting to the mantissa M of the operand a right shift procedure of the shift amount.

2. The format conversion method according to claim 1, wherein the shift amount of the right shift procedure to be conducted to the mantissa M of the operand is;

(a) an amount obtained by adding 1 to an absolute value of the first exponent $e_1$ when the first exponent $e_1$ is a negative value;

(b) 1 when the first exponent $e_1$ is 0; and (c) 0 when the first exponent $e_1$ is a positive value.

3. The format conversion method according to claim 1, wherein when the first exponent $e_1$ is a negative value, the mantissa M of the operand is shifted to right by an amount obtained by adding 1 to an absolute value of the first exponent $e_1$ to obtain a first mantissa $m_2$, then a second mantissa $m_3$ obtained by rounding the first mantissa $m_2$ to the second bit length is made to be the mantissa $\mu$ of the lower-precision floating point number and 0 is made to be the exponent $\epsilon$ of the lower-precision floating point number to obtain a denormalized conversion result;

when the first exponent $e_1$ is 0, the mantissa M of the operand is shifted to right by 1 bit to obtain a third mantissa $m_4$, the third mantissa $m_4$ is rounded to the second bit length to obtain a fourth mantissa $m_5$, then 0 and the fourth mantissa $m_5$ are respectively made to be the exponent $\epsilon$ and the mantissa $\mu$ of the lower-precision floating point number to obtain a denormalized conversion result when no carry is caused by rounding the third mantissa $m_4$, and a second exponent $e_3$ obtained by adding 1 to the first exponent $e_1$ and the fourth mantissa $m_5$ are respectively made to be the exponent $\epsilon$ and the mantissa $\mu$ of the lower-precision floating point number to obtain a normalized conversion result when a carry is caused by rounding the third mantissa $m_4$; and when the first exponent $e_1$ is a positive value, the mantissa M of the operand is rounded to the second bit length to obtain a fifth mantissa $m_6$, the first exponent $e_1$ and the fifth mantissa $m_6$ are respectively made to be the exponent $\epsilon$ and the mantissa $\mu$ of the lower-precision floating point number to obtain a normalized conversion result when no carry is caused by rounding the mantissa M of the operand, and a third exponent $e_4$ obtained by adding 1 to the first exponent $e_1$ and a sixth mantissa $m_7$ obtained by shifting the fifth mantissa $m_6$ to right by 1 bit are respectively made to be the exponent $\epsilon$ and the mantissa $\mu$ of the lower-precision floating point number to obtain a normalized conversion result when a carry is caused by rounding the mantissa M of the operand.

4. A format conversion method of an operand expressed as a double-precision floating point number having an exponent E and a mantissa M to a single-precision floating point number, comprising the steps of:

obtaining a first exponent $e_1$ by subtracting an exponent bias of the double-precision floating point number from the exponent E of the operand and by adding an exponent bias of the single-precision floating point number thereto;

(a) when the first exponent $e_1$ is a negative value, obtaining a first mantissa $m_2$ by shifting the mantissa M of the operand to right by an amount obtained by adding 1 to an absolute value of the first exponent $e_1$, and making a second mantissa $m_3$ obtained by rounding the first mantissa $m_2$ to a predetermined bit length a mantissa of the single-precision floating point number to be obtained, and making 0 an exponent of the single-precision floating point number to be obtained in order to obtain a denormalized conversion result;

(b) when the first exponent $e_1$ is 0, obtaining a third mantissa $m_4$ by shifting the mantissa M of the operand to right by 1 bit, obtaining a fourth mantissa $m_5$ by rounding the third mantissa $m_4$ to the predetermined bit length, making 0 and the fourth mantissa $m_5$ respectively an exponent and a mantissa of the single-precision floating point number to be obtained in order to obtain a denormalized conversion result when no carry is caused by rounding the mantissa $m_4$, and making a second exponent $e_3$ obtained by adding 1 to the first exponent $e_1$ and the fourth mantissa $m_5$ respectively an exponent and a mantissa of the single-precision floating point number to be obtained in order to obtain a normalized conversion result when a carry is caused by rounding the third mantissa $m_4$; and (c) when the first exponent $e_1$ is a positive value, obtaining a fifth mantissa $m_6$ by rounding the mantissa M of the operand to the predetermined bit length, making the first exponent $e_1$ and the fifth mantissa $m_6$ respectively an exponent and a mantissa of the single-precision floating point number to be obtained in order to obtain a normalized conversion result when no carry is caused by rounding the mantissa M of the operand, and making a third exponent $e_4$ obtained by adding 1 to the first exponent $e_1$ and a sixth mantissa $m_7$ obtained by shifting the fifth mantissa $m_6$ to right by 1 bit respectively an exponent and a mantissa of the single-precision floating point number to be obtained in order to obtain a normalized conversion result when a carry is caused by rounding the mantissa M of the operand.

5. A format converting device for converting an operand expressed as a double-precision floating point number having an exponent E and a mantissa M to a single-precision floating point number, comprising:

an exponent evaluating unit having functions of obtaining a first exponent $e_1$ to be an exponent of the single-precision floating point number by subtracting an exponent bias of the double-precision floating point number from the exponent E of the operand and by adding an exponent bias of the single-precision floating point number thereto and of outputting the first exponent $e_1$ and a numerical value $|e_1|+1$ obtained by adding 1 to an absolute value of the first exponent $e_1$; and a first shifter having a function of outputting a numerical value to be a mantissa of the single-precision floating point number obtained by shifting the mantissa M of the operand to right by an amount specified with the numerical value $|e_1|+1$ outputted from said exponent evaluating unit when the first exponent $e_1$ is a negative value, outputting a numerical value to be a mantissa of the single-precision floating point number obtained by shifting the mantissa M of the operand to right by 1 bit when the first exponent $e_1$ is 0, and outputting a numerical value identical with the mantissa M of the operand to be a mantissa of the single-precision floating point number when the first exponent $e_1$ is a positive value.

6. The format converting device according to claim 5, further comprising:

a rounding unit for outputting, as a corrected mantissa of the single-precision floating point number to be obtained, a numerical value obtained by rounding the numerical value outputted from said first shifter to a predetermined bit length;

a second shifter for outputting, as a further corrected mantissa of the single-precision floating point number to be obtained, a numerical value obtained by shifting the numerical value outputted from said rounding unit to right by 1 bit when the first exponent $e_1$ is a positive value and a carry is caused by rounding in said rounding unit; and an exponent correcting unit for outputting, as a corrected exponent of the single-precision floating point number to be obtained, a numerical value obtained by adding 1 to the first exponent $e_1$ outputted from said exponent evaluating unit when a carry is caused by rounding in said rounding unit.

7. A format conversion method of a fixed point number as a integer type operand having a most significant bit expressing a sign and an integer part of a first bit length, wherein a negative value is expressed by 2's complement, to a normalized floating point number having an exponent $\epsilon$ to which a bias is added and a mantissa $\mu$ of a second bit length which is shorter than the first bit length, comprising the steps of:

judging whether the operand is a positive value or a negative value based on the most significant bit of the operand;

(a) when the operand is a positive value,
obtaining a distance between the most significant bit of the operand and a bit which is 1 and nearest the most significant bit as a required left shift amount LSA,
obtaining a first mantissa $m_1$ by shifting the operand to left by the left shift amount LSA,
obtaining a first exponent $e_1$ by subtracting the left shift amount LSA from the first bit length of the integer part of the operand and by adding the exponent bias of the floating point number thereto, and
when the left shift amount LSA is greater than or equal to a threshold obtained by subtracting the second bit length from the number of bits of the operand including the most significant bit, making the first exponent $e_1$ and the first mantissa $m_1$ respectively the exponent $\epsilon$ and the mantissa $\mu$ of the floating point number to be obtained,
when the left shift amount LSA is smaller than the threshold, obtaining a second mantissa $m_2$ by rounding the first mantissa $m_1$ to the second bit length, and making the first exponent $e_1$ and the second mantissa $m_2$ respectively the exponent $\epsilon$ and the mantissa $\mu$ of the floating point number to be obtained when no carry is caused by rounding the first mantissa $m_1$, making a second exponent $e_2$ obtained by adding 1 to the first exponent $e_1$ and a third mantissa $m_3$ obtained by shifting the second mantissa $m_2$ to right by 1 bit respectively the exponent $\epsilon$ and the mantissa $\mu$ of the floating point number to be obtained when a carry is caused by rounding the first mantissa $m_1$; and (b) when the operand is a negative value,
obtaining a distance between the most significant bit of the operand and a bit which is 0 and nearest the most significant bit as a required left shift amount LSA,
obtaining a fourth mantissa $m_4$ by shifting the operand to left by the left shift amount LSA,
obtaining a third exponent $e_3$ by subtracting the left shift amount LSA from the first bit length of the integer part of the operand and by adding the exponent bias of the floating point number thereto,
obtaining a fifth mantissa $m_5$ by subtracting the fourth mantissa $m_4$ from 0, and
obtaining a sixth mantissa $m_6$ by rounding the fifth mantissa $m_5$ to the second bit length, and making the third exponent $e_3$ and the sixth mantissa $m_6$ respectively the exponent $\epsilon$ and the mantissa $\mu$ of the floating point number to be obtained when no carry is caused by rounding the fifth mantissa $m_5$, making a fourth exponent $e_4$ obtained by adding 1 to the third exponent $e_3$ and a seventh mantissa $m_7$ obtained by shifting the sixth mantissa $m_6$ to right by 1 bit respectively the exponent $\epsilon$ and the mantissa $\mu$ of the floating point number to be obtained when a carry is caused by rounding the fifth mantissa $m_5$.

8. The format conversion method according to claim 7, further comprising a step of:
specifying the threshold of the left shift amount LSA to 8 so that an operand having an integer part of 31-bit length is converted to a normalized single-precision floating point number having a fraction of 23-bit length.

9. A format converting device for converting an operand a total bit number of which is 32 having a most significant bit expressing a sign and an integer part of 31-bit length, wherein a negative value is expressed by 2's complement, to a normalized single-precision floating point number having an exponent to which a bias is added and a fraction of 23-bit length, comprising:

an advancing 1 detector having a function of detecting a bit which is 1 and nearest the most significant bit of the operand when the operand is a positive value, detecting a bit which is 1 and nearest a most significant bit of data obtained by inverting all bits of the operand, respectively, to output a distance between the detected bit and the most significant bit as a required left shift amount LSA;

a first shifter for outputting a numerical value obtained by shifting the operand to left by the left shift amount LSA;

an exponent evaluating unit for outputting, as an exponent of the single-precision floating point number to be obtained, a numerical value obtained by subtracting the left shift amount LSA from 31 and by adding the exponent bias of the single-precision floating point number thereto;

an adding/subtracting unit having a function of receiving an shifted output of said first shifter and 0 and outputting, as an intermediate data, the shifted output plus 0 when the operand is a positive value, a numerical value obtained by subtracting the shifted output from 0 when the operand is a negative value, respectively;

a rounding unit for outputting, as a corrected mantissa of the single-precision floating point number to be obtained, a numerical value obtained by rounding the intermediate data outputted from said adding/subtracting unit to a predetermined bit length when the operand is a negative value or when the operand is a positive value and the left shift amount LSA is smaller than 8;

a second shifter for outputting, as a further corrected mantissa of the single-precision floating point number to be obtained, a numerical value obtained by shifting the numerical value outputted from said rounding unit to right by 1 bit when a carry is caused by rounding in said rounding unit; and an exponent correcting unit for outputting, as a corrected exponent of the single-precision floating point number to be obtained, a numerical value obtained by adding 1 to the numerical value outputted from said exponent evaluating unit when a carry is caused by rounding in said rounding unit.

* * * * *